United States Patent [19]

French et al.

[11] 4,148,196

[45] Apr. 10, 1979

[54] MULTIPLE STAGE CRYOGENIC PUMP AND METHOD OF PUMPING

[75] Inventors: John B. French; Neil M. Reid, both of Thornhill; Janette A. Buckley, Willowdale; all of Canada

[73] Assignee: Sciex Inc., Thornhill, Canada

[21] Appl. No.: 790,215

[22] Filed: Apr. 25, 1977

[51] Int. Cl.$^2$ .............................................. B01D 5/00
[52] U.S. Cl. ..................................... 62/55.5; 62/100; 62/268; 55/269; 55/DIG. 15
[58] Field of Search ............ 62/55.5, 100, 268, 514 R; 55/135, 269, DIG. 15; 250/457, 289; 34/5, 92; 214/17 B

[56] References Cited

U.S. PATENT DOCUMENTS

| | | | |
|---|---|---|---|
| 3,579,997 | 5/1971 | Rapinat | 62/55.5 |
| 3,648,473 | 3/1972 | Stephenson | 62/55.5 |
| 3,712,074 | 1/1973 | Boissin | 62/55.5 |
| 3,769,806 | 11/1973 | Boissin et al. | 62/55.5 |
| 3,864,840 | 2/1975 | Baskin | 34/5 |

Primary Examiner—Ronald C. Capossela
Attorney, Agent, or Firm—Rogers, Bereskin & Parr

[57] ABSTRACT

A multiple stage cryogenic vacuum pump is disclosed for transferring matter or species between a gas and a vacuum chamber. The vacuum chamber has an orifice through which the matter or species moves and through which some of the gas leaks into the chamber. The chamber also has an interior surface which is spaced from the path of movement of the matter or species and encircles such path, and an internal divider extending to a position adjacent the interior surface and dividing the chamber into a first region adjacent the orifice and a second region downstream from the first region, with the interior surface extending in both regions. The surface is cooled by a single refrigerating device to below the condensation temperature of the gas, to produce a pressure below atmospheric in the first region and a lower pressure in the second region. The divider contains an aperture through which the matter or species travels and may itself be cooled to precool gas contacting it. The matter or species may be ions or may be a strip of material to be treated. In the latter case the gas which is cryopumped can be warmed and flowed countercurrent to the strip to precondition the strip prior to its entry into the vacuum chamber.

15 Claims, 7 Drawing Figures

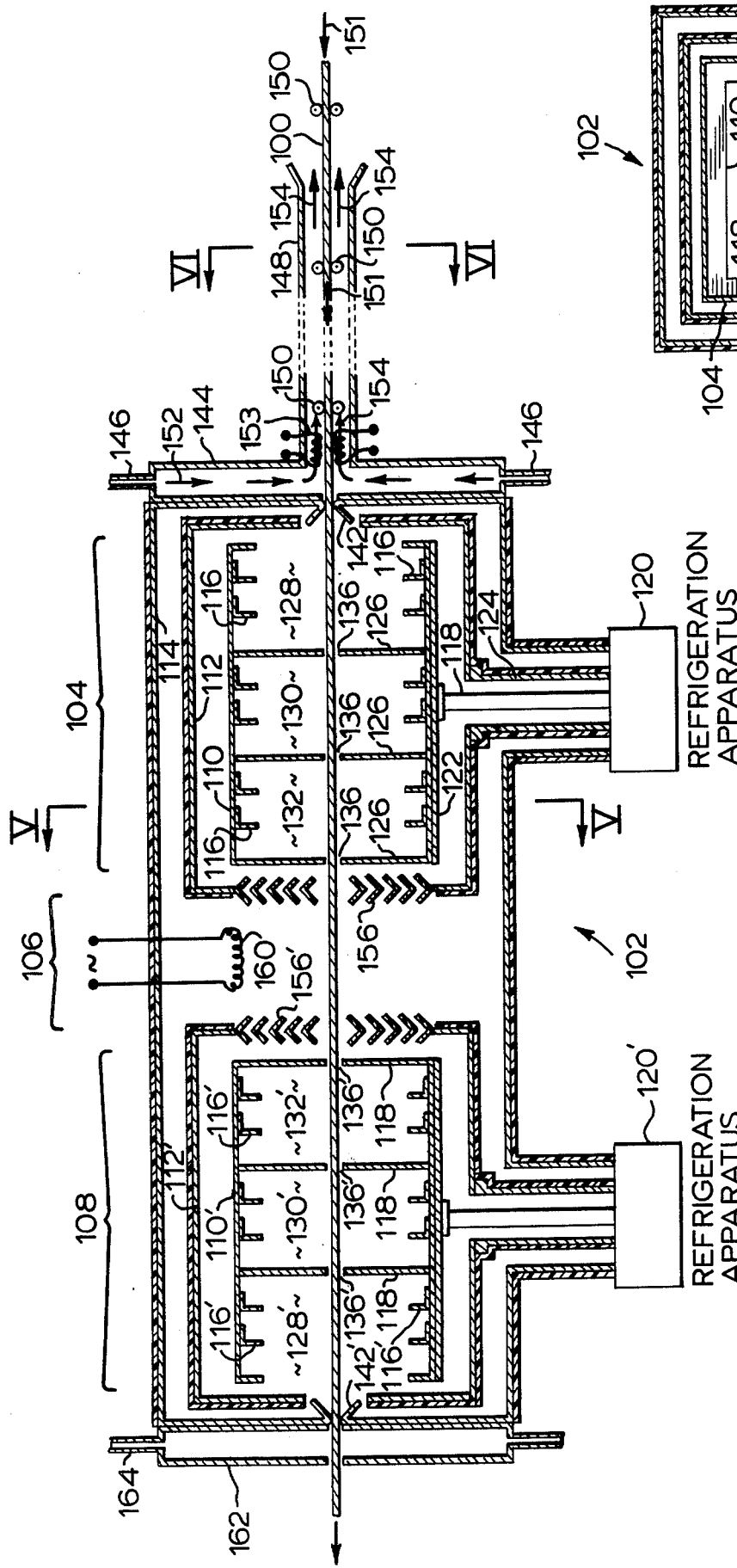
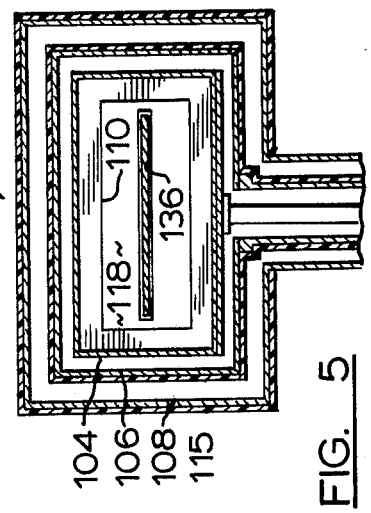
FIG. 5
FIG. 4
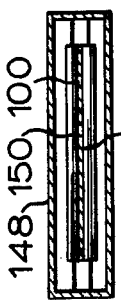
FIG. 6

MULTIPLE STAGE CRYOGENIC PUMP AND METHOD OF PUMPING

This invention relates to a multiple stage cryogenic vacuum pump and to a method of introducing matter or species into a vacuum.

It is sometimes necessary to transfer matter or species from an atmospheric pressure region into a vacuum. For example, the use of a mass spectrometer to analyze ions requires that the ions in question be transferred into a vacuum, which the mass spectrometer requires for operation. In addition, certain material treatments, e.g. deposition of thin layers of metal on materials, can best be performed in a vacuum.

Difficulties have been encountered in admitting matter or species into a vacuum chamber. In the case of ions, the inlet aperture to the chamber has been required to be extremely small, because of the limited capacity of conventional pumps which have been used. In the case of other materials to be processed in vacuum, these materials have been processed in batches. Each batch has been placed in the vacuum chamber; the chamber has been evacuated, the materials processed, and the chamber has then been refilled with another gas and opened. This is a slow and costly process. Processing has also been carried out continuously using a number of separately pumped stages, using individual and expensive pumps.

Accordingly, it is an object of the invention to provide a method and apparatus for continuously transferring matter or species between a gas and a vacuum, in which a particular form of staged cryopumping is used. More particularly the invention in one of its aspects provides apparatus for transferring matter or species between a gas and a vacuum, said gas being essentially a gas, which when deposited in solid phase, has a vapour pressure substantially less than atmospheric at a predetermined temperature, said apparatus comprising:

(1) a vacuum chamber having an orifice therein, for travel through said orifice of said matter or species, (2) means for moving said matter or species through said orifice, (3) said opening being dimensioned to permit leakage of some of said gas into said chamber as said matter or species moves therethrough, (4) means for guiding said matter or species along a predetermined path in said chamber, (5) said chamber having an interior surface spaced from said path and substantially encircling said path, (6) a single refrigerating device for cooling said surface to said predetermined temperature whereby to deposit said gas in solid phase on said surface, (7) said chamber having at least one internal divider dividing said chamber into a first region adjacent said orifice and a second region downstream from said first region, said divider having an aperture at said path to permit passage of said matter or species therethrough, said surface extending in both said regions and said divider extending to a location at least closely adjacent said surface, whereby when said surface is cooled to said predetermined temperature, the pressure in said second region is lower than that in said first region but said matter or species may be guided along said path between said first region and said second region.

In one embodiment of the invention, the gas which enters the vacuum chamber with the matter or species is also used to precondition the matter or species before the latter is admitted to the vacuum chamber.

Further objects and advantages of the invention will appear from the following description, taken together with the accompanying drawings in which:

FIG. 4 is a diagrammatic cross-sectional view showing a third embodiment of the invention;

FIG. 5 is a sectional view along lines V—V of FIG. 4; and

FIG. 6 is a sectional view along lines VI—VI of FIG. 4.

Figure 2:
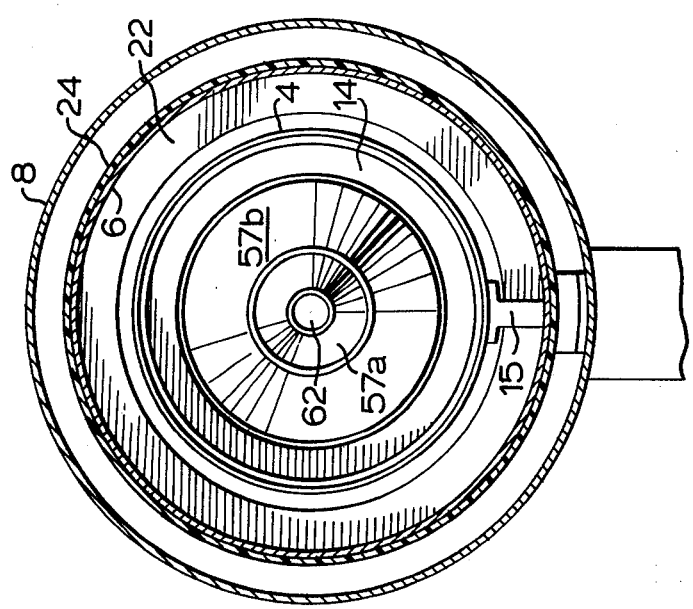
FIG. 2 is a sectional view along lines II—II of FIG. 1.
Figure 1:
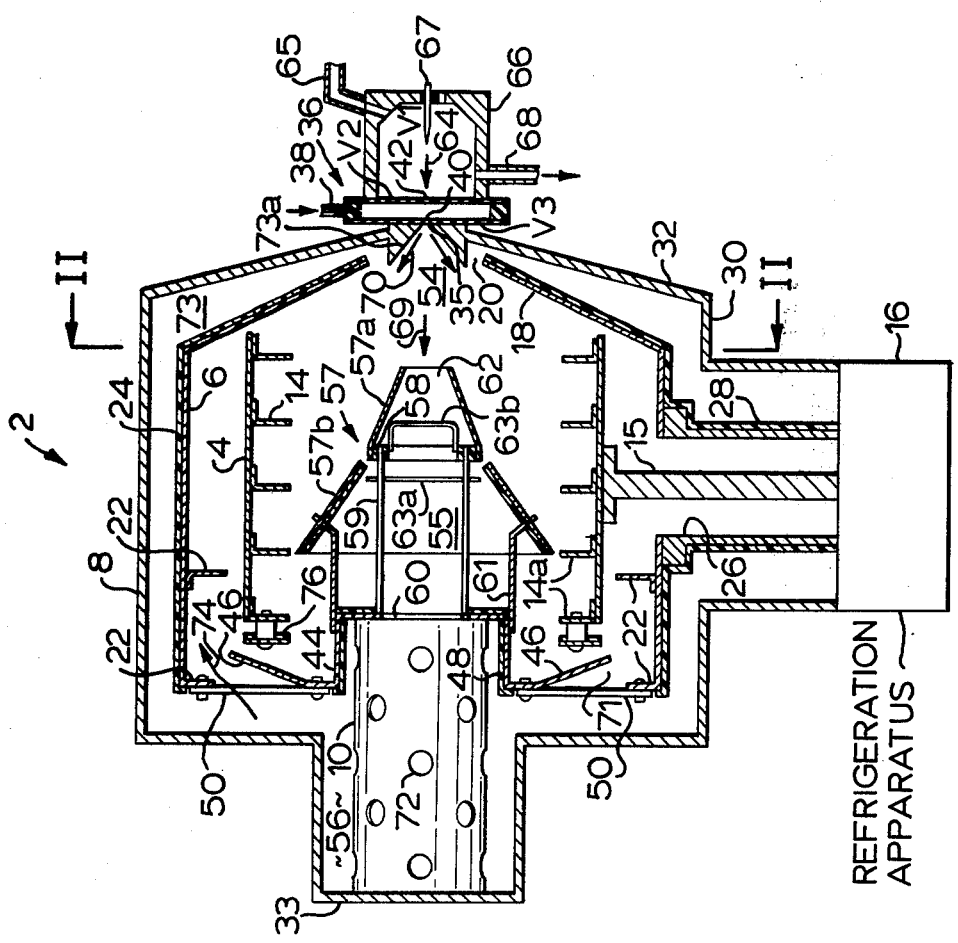
FIG. 1 is a view, partly in cross section, showing a vacuum chamber and mass spectrometer according to the invention.

Reference is first made to FIGS. 1 and 2, which shows a vacuum system generally indicated at 2. The vacuum system 2 includes an inner shell 4, an intermediate shell 6, and an outer vacuum shell 8. Located within the outer shell 8 system is a mass spectrometer generally indicated at 10.

The inner shell 4 is substantially cylindrical in form, having an open front and rear. Spaced along the interior surface of the inner shell 4 are a number of spaced circumferential cooling fins 14. The cooling fins 14 are secured to the shell 4 and project radially inwardly therefrom, thereby extending the effective cooling area of the inner shell and thereby increasing the effective capture coefficient of the inner shell 4.

The inner shell 4 is mounted on and is in excellent thermal contact with a tubular finger or cold station 15 of a refrigerating mechanism 16. The mechanism 16 is typically able to extract three watts of thermal energy from the finger 15 at 20° K.

The intermediate shell 6 is open at its rear and is cylindrical in form but has a conical front 18 having an enlarged axial opening 20 therein. The interior surface of the intermediate shell 6, at its rear, is fitted with two longitudinally spaced, circumferential, radially inwardly directed fins 22 which serve as a radiation trap for heat which would otherwise be a load on the 20° K. surface 4. The exterior surface of the intermediate shell 6 is wrapped with multiple layers of insulation 24, such as plastic known under the trade mark Mylar, and which has been aluminized to produce a low emissivity, thus reducing heat radiation to the intermediate shell.

The intermediate shell is mounted on an outer finger or second cold station 26 of the refrigerating mechanism 16. The outer finger 26 is tubular and encircles the inner finger 15, so as to shield it from the ambient temperature. The refrigerating mechanism 16 is typically able to extract seven watts of thermal energy at 80° K. through the outer finger 26. The exterior of the outer finger 18 is insulated with aluminized plastic film as indicated at 28.

The outer vacuum shell 8 has a generally cylindrical sidewall 30, and front and rear walls 32, 33 respectively. The rear wall 33 is closed, but the front wall 32 has a small central axial opening 35 therein (typically 0.002 to 0.01 inches in diameter), coaxial with the opening 20. The outer shell 8 forms a gas-tight enclosure around the inner and intermediate shells 4,6 except for the front opening 35.

Connected to the front face 32 of the outer shell 8 is a gas curtain chamber 36. The gas curtain chamber 36 is a closed chamber, except for a curtain gas inlet orifice 38 at its edge walls, and except for central axial openings 40, 42, in its rear and front faces. The openings 40, 42 are axially aligned with the opening 35 so that matter or species can be transferred through the three openings into the vacuum chamber.

The mass spectrometer 10 is mounted from the rear wall 33 of the outer shell 8. The forward portion of the mass spectrometer projects into a protective cylindrical shell 44 having a rear generally radially outwardly directed and forwardly sloping flange 46. The interior and rear of the shell is insulated with aluminized plastic film, as indicated at 48, to reduce heat transfer from the mass spectrometer to the shells 4, 6 and to prevent the interior of the mass spectrometer from becoming too cold. The shell 44 is supported by several circumferentially spaced thermal connection straps 50 connected to the intermediate shell 6 so that heat is extracted from shell 44 at 80° K.

The vacuum chamber within the outer shell 8 is divided into three regions of interest. These regions are indicated generally at 54, 55, and 56. Regions 54, 55 are separated from each other by a metal cone 57 which is mounted on the front of the mass spectrometer 10 in the following manner. The cone 57 is divided into two portions 57a, 57b. The front cone portion 57a is mounted on a copper ring 58 which is in turn mounted on copper rods 59 which extend to the room temperature front surface 60 of the mass spectrometer 10. This holds the front cone portion 57a at a temperature close to room temperature. This arrangement has been found advantageous for use with ions and also prevents build up of condensed gas on the front cone portion 57a. The rear cone portion 57b is mounted on thermal connection straps 61 which extend forwardly from the shell 44, so that heat is removed from the rear cone portion 57b at 80° K. Ions are admitted into the cone 57 via a front opening 62 in the front cone portion 57a and are guided by a three element Einzel lens, two elements of which are indicated at 63a and 63b, and the third element of which is constituted by the front cone portion 57a. In a typical application, element 63a and front cone portion 57a are grounded and a desired potential is applied to element 63b.

Regions 55, 56 of the vacuum chamber are separated from each other by the sloped flange or baffle 46 at the rear of protective shell 44. Flange 46 permits gas to travel from region 56 to region 55 but reduces radiation from region 56 to regions 55 and 54.

In a typical application of the system, ions 64 to be analyzed are directed into the vacuum chamber through the openings 42, 40, 35. The ions may typically be introduced in one of the ways explained in U.S. Pat. No. 4,023,398 and entitled "Apparatus for Analyzing Trace Components".

Alternatively, and as shown in FIG. 1, a sample gas containing trace components to be analyzed may be introduced via an inlet duct 65 into a chamber 66 which is fitted with a discharge needle 67. The trace components may be ionized directly by the electric discharge from the needle 67 (which is insulated from the chamber 66 and is held at a potential indicated by V1), or the ionization process may be indirect, through chemical ionization. In the latter case one or more chemical reagent gases which may be included in the sample gas, are ionized by the discharge from the needle 67, and then react with the trace molecules to form trace ions. Other known ionization processes, e.g. plasma discharges, may also be used.

The trace ions, once formed, are drifted by appropriate potentials V2, V3 placed on the plates containing orifices 42, 40, through these orifices and into the vacuum chamber 2. The sample gas itself is blocked from entering the vacuum chamber by the curtain gas introduced via inlet 38 into the gas curtain chamber. The curtain gas, which may be conveniently inert cryopumpable gas such as argon, is admitted via inlet 38 into the curtain gas chamber 36 at a pressure such that a portion of the curtain gas effuses out the opening 42, to block the gases in chamber 66 from entering the vacuum system, and these gases, together with the portion of the curtain gas which effuses out opening 42, exit via an exit duct 68. A portion of the curtain gas also enters the vacuum chamber with the ions to be analyzed. If the sample gas is cryopumpable at the temperature achieved by the refrigeration apparatus and is clean, then the curtain gas chamber 36 may be omitted and the ions 64 admitted directly into the vacuum chamber 2.

When the ions 64 enter the vacuum chamber, they are guided by the Einzel lens described, and by such other electrostatic lens elements as may be provided, along a path indicated at 69. The ions are thus guided into the mass spectrometer 10 for analysis.

The bulk of the curtain gas which enters the vacuum chamber through opening 35 expands in a free jet within the outer shell 6, as indicated by lines 70. Much of this gas is pumped in region 54 by being condensed on the fins 14 in this region. This gas is pumped at a relatively low pressure, the pressure in region 54 typically being about $10^{-3}$ torr. The cone shaped deflector 57 deflects a substantial portion of the directed gas load entering region 54 along lines 70, preventing this gas from entering intermediate region 55 but admitting the ions through the front aperture 62. Since the rear portion 57b of deflector 57 is thermally connected to the outer finger 26 and hence is pumped at 80° K., the gas impinging on rear portion 57b is precooled before it contacts fins 14 in region 54. This reduces the load on the low temperature shell 4, which is desirable when the capacity of the low temperature portion of the heat pump is limited. Since the front cone portion 57a is not cooled (or if it is cooled, it is pumped at a temperature above the condensation temperature of gas entering the vacuum chamber), the buildup of a "snow drift" on the front of the deflector 60 is avoided.

The substantially unobstructed access of the gas load in the free jet 70 to the cryosurface or cooling fins 4 in region 54 helps provide a high pumping speed in this region. It will be realized that the gas originating in the free jet 70 is a directed gas load, which arrives at the cryosurface or fins 4 at supersonic speed if no obstacle is placed between the directed gas load and the cryosurface. Gas which arrives at the cryosurface in a directed supersonic flow arrives at a much greater rate than gas which is in random free molecular flow, and is therefore removed from region 54 with much greater effectiveness. Gas which is blocked by a surface without condensing there will arrive eventually at the cryosurface or fins 4 at the lesser rate of random free molecular flow.

Figure 2A:
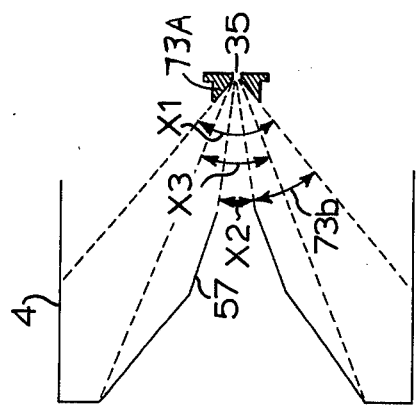
FIG. 2A is a diagrammatic view showing gas flows in the apparatus of FIGS. 1 and 2.

As shown in FIG. 2A, the free jet from orifice 35 is typically constrained by a conical surface 73a which encircles orifice 35 for a reason to be explained. The solid angle X1 of the free jet is thus constrained to about 90 degrees. In a typical embodiment of the invention, the solid angle X2 subtended at the orifice by the forward edge of deflector 57 was about 15 degrees, and the solid angle X3 subtended at the orifice by the rear edge of deflector 57 was about 45 degrees. The area of the lune or spherical segment 73b in which the directed gas flow can travel directly to the cryosurface or fins 4, or can reach the cryosurface with just one bounce off the deflector 57, is therefore quite large. The area of the lune 73b is $2r^2$ (X1-X2) where r is the radius and X1 and X2 are expressed in radians. Since angle X1 (90 degrees) is much more than angle X2 (about 15 degrees), therefore even though the gas density is greatest along the axis of the free jet 70 and falls off according to a cosine squared law, more than half of the directed gas load in the free jet 70 has substantially unobstructed access to the cryosurface 4. Substantially unobstructed access means that the gas encounters either no obstruction or an obstruction arranged to reflect the gas in a single reflection toward the cryosurface.

Some gas will enter the region 55. Part of this gas will be "directed" gas from the free jet from orifice 35 and will enter region 55 via opening 62 in deflector 57. Part of the gas will be background gas from region 54 and will enter region 55 partly through opening 62 and partly through the leak 71 at the rear edge of the deflector 57. Gas is also contributed by outgassing of the walls of the apparatus. All this gas in region 55 is pumped by the cooling fins 14a in this region, typically reducing the pressure in region 55 to about $10^{-4}$ torr.

Gas enters region 56 both via holes 72 in the casing of the mass spectrometer 10 (from the mass spectrometer), and by travelling through the space 73 between the shell 6 and the outer or vacuum shell 8. However, the gas load entering space 73 is relatively small, for the following reason. As shown, the front edge of the conical front 18 of shell 6 extends forwardly beyond the rear edge of conical surface 73a which encircles the opening 35. The surface 73a, which has at least a 90 degree whole angle to minimize interference with the free jet 70, shadows the space 73 from the directed gas load and permits only background gas flow into the space 73.

The gas in region 56 travels in the direction of arrow 74, is pre-cooled by contact with fins 22 and shell 6, and is pumped by condensation on the exterior surface of the inner shell 4. Some of this gas also leaks past baffle 46 to be condensed on the inner surface of shell 4. There is only a very small amount of this gas in region 56, and the pressure in region 56 is therefore typically approximately $10^{-5}$ torr, which is sufficiently low for good operation of most mass spectrometers.

In summary at this point, it will be seen that a staged vacuum pump has been provided, in which matter or species is admitted along with a jet of gas into the system, and the matter or species is guided through the system into an operating region (the mass spectrometer) which is the highest vacuum region of the system, while the gas is deflected and pumped to successively lower pressures in a series of stages between the inlet opening and the operating region, all utilizing a single refrigerating device to cool the surfaces which surround the path of the matter or species.

Although the use of a curtain gas such as argon or nitrogen is normally preferred, it will be appreciated that the system may be used to pump air itself. In that event, since certain trace gases in air, for example hydrogen and helium, are not pumped at 20° K., a ring of granular activated charcoal 76 may be provided, at the outer surface of the rear of the inner shell 4. The activated charcoal 76 at 20° K. will absorb gases such as hydrogen and helium, and when the system is taken out of service and warmed periodically (for example once per week) to remove gases condensed on the inner shell 4, the hydrogen and helium trapped by the activated charcoal will evaporate. The charcoal will usually be used even when the gas curtain is present, to remove noncryopumpable traces present in commercial grade gases.

In the embodiment shown in FIGS. 1 and 2, the deflector portion 57 is cooled to 80° K., and the deflector portion 57a is at or near room temperature. If desired, the entire deflector may be kept at room temperature. However, generally cooling of at least part of the deflector 57 is desirable to precool gas incident on it. If the deflector is made in one piece, as may occur when matter other than ions are being transferred, then the entire deflector 57 may be cooled, though preferably not to a temperature so low that gas will condense on it.

Figure 3:
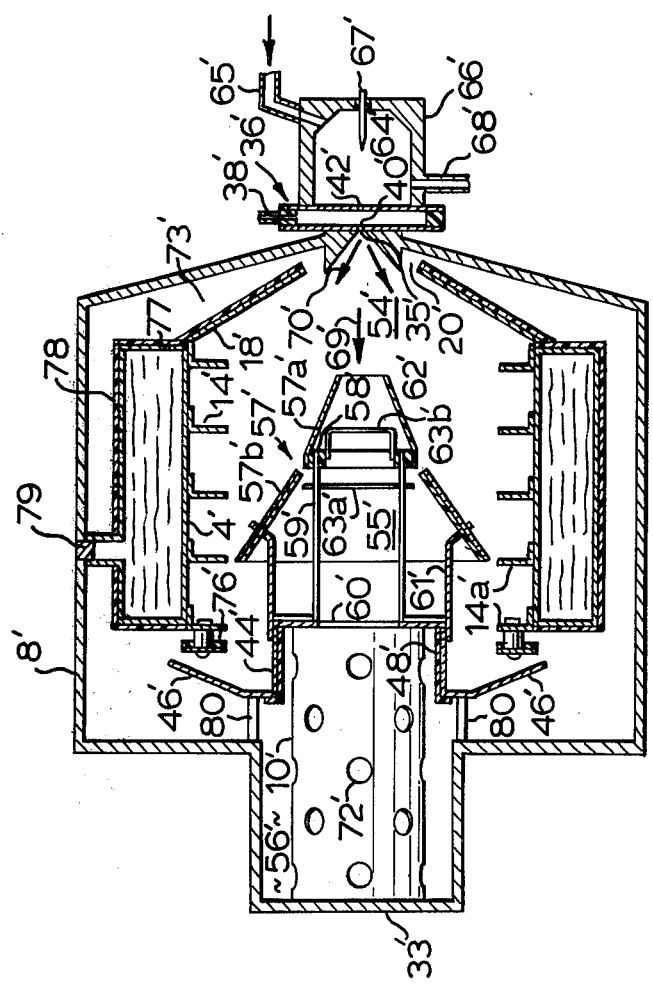
FIG. 3 is a diagrammatic cross sectional view showing a second embodiment of the invention.

Larger mechanical refrigeration sources may be used if desired, or alternatively, other cooling means, such as liquid nitrogen or liquid helium may be used, depending on the condensation temperature of the gas being pumped. Such an arrangement is diagrammatically indicated in FIG. 3, in which primed reference numerals indicate parts corresponding to those of FIGS. 1 and 2. In the FIG. 3 arrangement the intermediate shell 6 has been removed and instead a cylindrical tank 77 containing for example liquid nitrogen has been substituted. The inner surface of the tank 77 constitutes the inner shell 4, and its outer surface is insulated from the vacuum shell 8 by insulation 78. The tank 77 is filled through an opening 70 and is supported by conventional means not shown. It may be desirable not to precool gas by cooling the deflector 57', and the deflector portion 57b' may therefore be mounted directly on the vacuum shell by supports 80.

Reference is next made to FIG. 4 which shows another embodiment of the invention which may be used when it is desired to process a web of material 100. The material 100 may be metal or plastic which is to have another metal vacuum deposited thereon, or it may be any other material which is to be processed in a vacuum. The web 100 may also be a wire.

FIG. 4 shows a vacuum system generally indicated at 102. The vacuum system 102 includes an entry portion 104, an operating region 106, and an exit portion 108. The exit portion 108 is a mirror image of the entry portion 104 and primed reference numerals in portion 108 indicate parts corresponding to those of entry portion 104.

The entry portion 104 includes an inner shell 110, an intermediate shell 112, and an outer shell 114, all concentric as in the FIGS. 1 and 2 embodiment. The shells 110, 112, 114 may be any appropriate cross-section, e.g. rectangular as shown in FIG. 5. The inner surface of the inner shell 110 is fitted with longitudinally spaced, circumferential, radially inwardly directed cooling fins 116 and is connected to the cooling finger or cold station 118 of suitable refrigeration apparatus 120 to be pumped at a low temperature (e.g. 20° K.). Because of the length of the inner shell 110, an additional plate 122 of material having a high thermal conductivity may be fitted to the bottom of shell 110 and the finger 118 connected to plate 122, to facilitate removal of heat from the inner shell 110.

The intermediate shell 112 is connected to an insulated tubular cooling finger 124 concentric with finger 118, to be pumped at a higher temperature, for example 80° K. The outer or vacuum shell 114 seals the inner and intermediate shells 110, 112 against entry of air except at their ends as will be described, and is common to the entry, operating and exit portions 104, 106, 108.

The inner shell 110 is divided by dividers or baffles 126 into three regions 128, 130, 132. The dividers 126 extend from the inner surface of the inner shell to a position adjacent the web 100 and contain slits 136 to permit the web to pass therethrough.

At the front end of the entry portion 104 there is a pair of wipers 142, fixed to the end wall of outer shell 108, to guide the web 100 into the vacuum system. The wipers 142 are arranged to minimize gas leakage into the vacuum chamber, and also to shadow the front end of shell 112 from the directed gas load entering the chamber between the wipers 142. Further wipers or rollers (not shown) may be provided as required within the vacuum chamber, to guide the web 100 as it passes therethrough.

Also located at the front end of the entry portion 138 is a curtain gas chamber 144. The chamber 144 has curtain gas entry ducts 146 in its edge walls through which a suitable curtain gas may be fed into the curtain gas chamber 144. At the front of the curtain gas chamber there is located an elongated entry duct 148 through which the web 100 enters the vacuum system. The web is guided in the entry duct 148 by rollers 150, its direction being indicated by arrow 151.

When a web of material such as web 100 enters a vacuum chamber, gases which have been trapped or adsorbed by the web release or outgas at varying rates. One of the slowest gases to be released is water vapour, and to ensure removal of all or most of the water vapour from the web, it would normally be necessary to leave the web 100 in vacuum for a substantial period of time.

To reduce the time which the web 100 must remain in the vacuum system for outgassing prior to entry of the web into the processing region 128, the invention as shown in FIG. 4 provides for preconditioning of the web by the very gas which is cryopumped in the vacuum chamber. Specifically, curtain gas is fed as indicated by arrows 152 into the curtain gas chamber 144. The curtain gas may typically be heated dry argon or air. Most of the curtain gas enters the duct 148, where it is heated at its entry into the duct by heaters 153. The heated dry curtain gas flows counter-current to the web 100, as indicated by arrows 154, and thereby predries the web. This removes much of the water vapour in the web and which otherwise would outgas in the entry portion 136. This substantially reduces the load on the vacuum system and also permits a faster speed of travel for the web through the vacuum system. Without the preconditioning, it would be necessary to pass the web 100 much more slowly through the vacuum system.

As the web passes through the wipers 142 into the vacuum system, some of the curtain gas also enters the vacuum system. The curtain gas is pumped to successively lower pressures in regions 128, 130, 132 by the common cryogenic cooling of the inner shell 110. The curtain gas leaking through the slits 136 in the dividers 126 expands into each region and condenses on the cooling fins 116 in the various regions. Noncondensible trace gases such as hydrogen can be removed by activated charcoal (not shown) or by separate pumps.

In the FIG. 4 embodiment, the dividers 126 have been shown as being connected directly to the inner shell 110. This may reduce the temperature of the dividers 126 sufficiently so that a build-up of condensed carrier gas occurs at the slits 136. For strong web materials 100, this build-up will not matter, but if it is likely to damage or obstruct the web, then the dividers 126 can be wholly or partly insulated from the inner shell 110.

The web 100 is guided through the entry portion 104 by its passage through the slits 136. The edges of the slits may be made of low friction material to reduce resistance to movement of the web. If desired, additional rollers (not shown) may be located in the various regions of the vacuum chamber to help to guide the web 100.

When the web 100 reaches the operating region 106, it may be suitably processed, e.g. metal may be evaporated and deposited onto it, as indicated diagrammatically by filament 160 (which is connected to a suitable power source, not shown). Since the heat load in the operating region 106 may be quite high, the inner or cryoshells 110, 110' are shielded from heat radiation in the operating region by standard radiation baffles 156, 156' which forms extensions of the intermediate shells 112, 112' respectively. Gas in operating region 106 is pumped by its leakage through the baffles 156, 156' and slits 136, 136' into the adjacent regions 132, 132'. In this manner, a good vacuum can be provided in the operating region 106, depending on the process being conducted in region 106. Alternatively, the operating region 106 may if desired be provided with an additional or separate pump, not shown, to remove by products (such as occluded gases) of processes carried on within it. Also a single cryopump may be used in place of cryopumps 120, 120'.

After the web 100 has been processed in the operating region 106, it leaves the vacuum system via the exit portion 108 and wipers 142'. As shown, the outlet end of the exit region 128' may also be provided with a gas curtain chamber 162, into which curtain gas is fed via conduits 164. Some of the curtain gas enters the exit region 128' via the gaps around wipers 142', but this curtain gas is pumped to successively lower pressures in the manner previously described so as to maintain the pressure at an adequately low level adjacent and in the operating region 106. Again, it will be appreciated that if air is used as the operating fluid, then no gas curtain chamber will be required at the exit of the vacuum system, although a gas curtain chamber will still normally be used at the entrance so that the gas (air) may be heated and used to precondition the entering web.

Since there will normally be no outgas load on the web 100 when it leaves the operating region 128, the number of regions in the exit portion 108 may if desired be less than the number of regions in the entry portion 104.

Although the multiple stage cryopump of the invention has been shown in applications in which matter or species move from a higher pressure region into a vacuum region, the pump and method of the invention can also be used for matter or species moving from a vacuum chamber to a higher pressure region (as shown at the left hand side of FIG. 4). For example the invention may be used in applications where electron or other beams are generated in vacuum and are directed through an aperture to a location outside the vacuum.

The gas which is cryopumped by the multiple stage cryopump will depend on the application of the system. For some applications, gases having a relatively high vapour pressure (although still substantially less than atmospheric) and condensing at relatively high temperature (e.g. water vapour in some applications) may be used.

What we claim is:

1. Apparatus for transferring matter or species between a gas and a vacuum, said gas being essentially a gas, which when deposited in solid phase, has a vapour pressure substantially less than atmospheric at a predetermined temperature, said apparatus comprising:
    (1) a vacuum chamber having an orifice therein, for travel through said orifice of said matter or species,
    (2) means for moving said matter or species through said orifice,
    (3) said orifice being dimensioned to permit leakage of some of said gas into said chamber as said matter or species moves therethrough,
    (4) means for guiding said matter or species along a predetermined path in said chamber,
    (5) said chamber having an interior surface spaced from said path and substantially encircling said path,
    (6) a single refrigerating device for cooling said surface to said predetermined temperature whereby to deposit said gas in solid phase on said surface,
    (7) said chamber having at least one internal divider dividing said chamber into a first region adjacent said orifice and a second region downstream from said first region, said divider having an aperture at said path to permit passage of said matter or species therethrough, said surface extending in both said regions and said divider extending to a location at least closely adjacent said surface, whereby when said surface is cooled to said predetermined temperature, the pressure in said second region is lower than that in said first region but said matter or species may be guided along said path between said first region and said second region.

2. Apparatus according to claim 1 including a plurality of said dividers dividing said chamber into a plurality of regions, whereby to provide a plurality of pressure stages.

3. Apparatus according to claim 1 wherein said divider is of truncated conical shape, said aperture being at the apex of said divider and the base of said divider being located downstream from said apex, the apex of said aperture subtending a solid angle at said orifice substantially less than the solid angle at said free jet.

4. Apparatus according to claim 3 wherein said chamber includes an outer vacuum shell and a second shell within said vacuum shell, said vacuum shell and second shell defining an annular space therebetween, said interior surface being within said second shell, said chamber further including a conical surface encircling said orifice to constrain the solid angle of said gas extending through said orifice into said chamber, said second shell having a radially inwardly directed front portion extending to an entrance between said inner edge and said vacuum shell, said conical surface shadowing said entrance to block directed gas flow rate into said space.

5. Apparatus according to claim 3 and including a plurality of radially inwardly directed circumferential cooling fins, said fins being spaced longitudinally along said interior surface.

6. Apparatus according to claim 5 wherein said chamber includes outer, intermediate and inner concentric shells, said interior surface being the interior surface of said inner shell, said apparatus including means for cooling said inner shell to said predetermined temperature, means for cooling said intermediate shell to a second temperature below ambient temperature but higher than said intermediate temperature, said outer shell sealing said intermediate and inner shells against ingress of air.

7. Apparatus according to claim 5 including means for maintaining said divider at a temperature above said predetermined temperature.

8. Apparatus according to claim 7 wherein said means for guiding is mounted on said divider.

9. Apparatus according to claim 1 and including means for moving a strip of material from said gas into said vacuum chamber, and further including a gas curtain chamber located at the entrance to said vacuum chamber and communicating with said orifice, said gas curtain chamber having an entrance opening for said strip to travel therethrough and through said orifice, means for injecting said gas into said gas curtain chamber, means for heating said gas, conduit means associated with said gas curtain chamber for receiving and enveloping a selected portion of said strip, means for directing said heated curtain gas through said conduit means in a direction opposite to that of said strip as said strip moves through said gas curtain chamber, whereby to precondition said strip prior to its entry into said vacuum chamber.

10. Apparatus according to claim 9 wherein said vacuum chamber includes an entry portion, an operating region and an exit portion, said entry and exit portions each having a plurality of said dividers dividing each of said entry and exit portions into a plurality of regions, means for guiding said matter or species through said gas curtain chamber and through said entry, operating and exit portions, said exit portion having an exit opening for egress of said matter or species and for ingress of said gas, and means in said operating region for operating on said matter or species.

11. Apparatus according to claim 1 and including means for producing trace ions from a trace component to be analyzed, said trace ions being said matter or species, said means for moving being an electric field for moving said ions into said vacuum chamber, said means for guiding being electrostatic lens means.

12. A method of transferring matter or species between a vacuum chamber and a higher pressure region, comprising:
    (a) continuously moving said matter or species along a predetermined path between said higher pressure region and a vacuum chamber of the kind having an interior surface spaced from and substantially encircling said path and an internal divider dividing said chamber into a first region adjacent said gaseous region and a second region adjacent said first region with said surface extending on both sides of said divider, said path extending through an aperture in said divider,
    (b) selecting a gas which, when deposited in solid phase, has a vapour pressure substantially less than atmospheric at a predetermined temperature,
    (c) continuously substantially filling said higher pressure region with said gas and continuously admitting some of said gas into said first region at the location at which said path enters said chamber, (d) and cooling said surface with a single refrigerating device to said predetermined temperature and establishing a first pressure, below atmospheric, in said first region and a second and lower pressure in said second region.

13. A method according to claim 12 including producing, in said higher pressure region, trace ions from a trace component to be analyzed, said trace ions being said matter or species, and moving said trace ions from said higher pressure region along said path into said vacuum chamber.

14. A method of introducing matter into a vacuum for processing, comprising:

(a) guiding said matter through an inlet conduit and into an inlet opening of a vacuum chamber, (b) supplying a curtain gas consisting essentially of a gas which, when deposited in solid phase, has a vapour pressure substantially less than atmospheric at a predetermined temperature, (c) directing said curtain gas into said inlet opening with said matter and also through said inlet conduit at a pressure sufficient substantially to prevent ingress of other gas into said inlet conduit, (d) heating said gas which passes through said inlet conduit so that said gas, as it passes said matter, will dry said matter, (e) and cooling an interior surface of said vacuum chamber to a temperature below said predetermined temperature, whereby to condense said gas in said vacuum chamber.

15. A method according to claim 14 and including the step of moving said matter into said chamber in a continuous strip, and then withdrawing said strip from said chamber through an exit opening in said chamber, and further including the step of admitting said gas into said exit opening and cooling an interior surface of said chamber to a temperature below said predetermined temperature, to condense on said surface said gas admitted through said exit opening.

* * * * *